United States Patent
Matsumoto

(10) Patent No.: US 8,154,355 B2
(45) Date of Patent: Apr. 10, 2012

(54) HIGH-FREQUENCY COLPITTS CIRCUIT

(75) Inventor: Takashi Matsumoto, Sayama (JP)

(73) Assignee: Nihon Dempa Kogyo Co., Ltd, Tokyo (JP)

( * ) Notice: Subject to any disclaimer, the term of this patent is extended or adjusted under 35 U.S.C. 154(b) by 14 days.

(21) Appl. No.: 12/654,606

(22) Filed: Dec. 24, 2009

(65) Prior Publication Data

US 2010/0156548 A1 Jun. 24, 2010

(30) Foreign Application Priority Data

Dec. 24, 2008 (JP) .............. P. 2008-327023

(51) Int. Cl.
*H03B 5/32* (2006.01)
(52) U.S. Cl. .............. 331/158; 331/116 R; 331/116 FE
(58) Field of Classification Search .............. 331/116 R, 331/116 FE, 158
See application file for complete search history.

(56) References Cited

U.S. PATENT DOCUMENTS

| | | | | |
|---|---|---|---|---|
| 5,712,599 | A * | 1/1998 | Kleinberg | 331/108 B |
| 7,352,256 | B2 * | 4/2008 | Oita | 331/158 |
| 7,369,005 | B2 * | 5/2008 | Kasahara | 331/158 |
| 2007/0090889 | A1 * | 4/2007 | Nomura | 331/167 |
| 2008/0156099 | A1 * | 7/2008 | Ishii et al. | 73/579 |

FOREIGN PATENT DOCUMENTS

| | | |
|---|---|---|
| JP | S57-4808 | 1/1982 |
| JP | 03-019506 | 1/1991 |
| JP | 2000-201025 | 7/2000 |
| JP | 2001-148614 | 5/2001 |
| JP | 2003-152454 | 5/2003 |
| JP | 2004-048631 | 2/2004 |
| JP | 2004-266583 | 9/2004 |
| JP | 2004-289207 | 10/2004 |
| JP | 2004-304667 | 10/2004 |
| JP | 2005-072828 | 3/2005 |
| JP | 2005-236607 | 9/2005 |
| JP | 2006-066942 | 3/2006 |
| JP | 2007-020158 | 1/2007 |
| JP | 2007-116487 | 5/2007 |
| JP | 2007-150461 | 6/2007 |
| JP | 2008-211757 | 9/2008 |

* cited by examiner

*Primary Examiner* — Joseph Chang
*Assistant Examiner* — Jeffrey Shin
(74) *Attorney, Agent, or Firm* — Jacobson Holman PLLC

(57) ABSTRACT

A high-frequency Colpitts circuit having a feedback transistor Q2 in addition to an oscillation transistor Q1 is provided, wherein a collector of the transistor Q1 is connected to a base of the transistor Q2, a supply voltage is applied to a collector of the transistor Q2 through a resistance R5 and is connected to an output terminal, the collector is connected to a base of the transistor Q1 through a feedback resistance Rf, a crystal oscillator and one end of capacitors C1 and C2 connected in series are connected to the base, the other end of the capacitors is grounded, and a point between the capacitors C1 and C2 is connected to an emitter of the transistor Q1 and is grounded through a resistance R4.

4 Claims, 3 Drawing Sheets

HIGH-FREQUENCY COLPITTS CIRCUIT

This application has a priority of Japanese no. 2008-327023 filed Dec. 24, 2008, hereby incorporated by reference.

BACKGROUND OF THE INVENTION

1. Field of the Invention

The present invention relates to a high-frequency Colpitts circuit, and especially relates to the high-frequency Colpitts circuit, which realizes a stable circuit while ensuring a negative resistance at a high frequency.

2. Description of the Related Art

[Conventional Colpitts Circuit: FIG. 6]

A conventional Colpitts circuit is described with reference to FIG. 6. FIG. 6 is a configuration diagram of the conventional Colpitts circuit.

As shown in FIG. 6, the conventional Colpitts circuit is provided with a terminal (Port P1) to which a crystal oscillator is connected and a transistor Q1 for amplifying an oscillation frequency of the crystal oscillator in which the terminal is connected to a base of the transistor Q1, a supply voltage (V_DC) is applied to a collector of the transistor Q1 through a resistance R3, further the supply voltage is connected to the base through a resistance R1 and the base is grounded through a resistance R2.

Also, an emitter of the transistor Q1 is grounded through a resistance R4 and the base is grounded through capacitors C1 and C2 connected in series, and a point between the capacitors C1 and C2 is connected to the emitter. Then, an output terminal for outputting an amplified oscillation frequency from the collector is provided.

Also, a negative resistance characteristic in the Colpitts circuit in FIG. 6 is shown in FIG. 7. FIG. 7 is a view showing the negative resistance characteristic of the conventional Colpitts circuit. In FIG. 7, an abscissa axis represents a value of the frequency and a longitudinal axis represents a value of the negative resistance.

In FIG. 7, the negative resistance is realized at 200 MHz or higher.

Meanwhile, as the related conventional art, there is Japanese Patent Application Laid-Open (JP-A) No. 2007-116487 "High-Frequency Colpitts Oscillation Circuit" (Applicant: Epson Toyocom Corporation).

JP-A No. 2007-116487 discloses the high-frequency Colpitts circuit provided with the Colpitts oscillation circuit and the collector-grounded amplification circuit in which the output terminal of the Colpitts oscillation circuit is connected to the input terminal of the collector-grounded amplification circuit, and the output of the collector-grounded amplification circuit is fed back to the Colpitts oscillation circuit.

Also, as another conventional art, there is JP-A No. 2004-266583 "Piezoelectric Oscillator" (Applicant: TOYO Communication Equipment Co., Ltd.).

JP-A No. 2004-266583 discloses the configuration of the Colpitts-type piezoelectric oscillator in which the signal from the emitter of the transistor is fed back to the base, and further the resonance circuit for controlling the negative resistance is provided on the emitter side.

Also, as another conventional art, there is JP-A No. 2004-304667 "Piezoelectric Oscillator" (Applicant: TOYO Communication Equipment Co., Ltd.).

JP-A No. 2004-304667 discloses the configuration of the Colpitts-type piezoelectric oscillator in which the signal from the source of the FET transistor TR2 is fed back to the base of the oscillation transistor TR1, and the parallel synchronization circuit for controlling the oscillation frequency is provided on the drain side of the FET transistor.

SUMMARY OF THE INVENTION

In the above-described conventional Colpitts circuit, however, there is a problem that, although it is required to make capacitance values of the capacitors C1 and C2 in FIG. 6 smaller in order to ensure the negative resistance at the high frequency, when they are made too small, the circuit is easily affected by a pattern and an external condition, so that the stable circuit is not realized.

Meanwhile, in the above-described conventional Colpitts circuit, it is considered that a limit value of the frequency of the stable oscillation is 200 MHz to 300 MHz.

Also, in JP-A Nos. 2007-116487, 2004-266583, 2004-304667, it is not configured such that the signal from the collector of the transistor of the feedback circuit is fed back to the base of the oscillation transistor through the feedback resistance, and it is not considered to make the circuit high-frequency compatible and further make the scale of the circuit smaller.

The present invention is made in consideration of the above-described circumstances, and an object thereof is to provide the high-frequency Colpitts circuit capable of realizing the stable oscillation even at the high frequency and is capable of making the scale of the circuit smaller.

The present invention for solving the problem in the above-described conventional arts is a high-frequency Colpitts circuit for realizing an oscillation at a high frequency provided with an oscillation transistor for amplifying an oscillation frequency signal from a crystal oscillator and a feedback transistor to a base of which a collector of the oscillation transistor is connected, wherein a supply voltage is applied to the collector of the oscillation transistor through a first resistance, one end of first and second capacitors connected in series is connected to a base of the oscillation transistor and the other end of the capacitors is grounded, a point between the first and second capacitors is connected to an emitter of the oscillation transistor and is grounded through a second resistance, the feedback transistor to the base of which the collector of the oscillation transistor is connected is provided, the supply voltage is applied to a collector of the feedback transistor through a third resistance and is connected to an output terminal, and the collector is connected to the base of the oscillation transistor through a feedback resistance, so that this has an effect of realizing the stable oscillation even at the high frequency and of making the scale of the circuit smaller.

Meanwhile, a resonance circuit of the second capacitor and a coil connected in parallel may be provided in place of the second capacitor.

The present invention is the high-frequency Colpitts circuit, wherein the resonance circuit of the second capacitor and the coil connected in parallel is provided in place of the second capacitor.

The present invention is the high-frequency Colpitts circuit, wherein the point between the first and second capacitors is connected to the emitter of the oscillation transistor, the second resistance and a third capacitor connected in parallel is connected in series to the coil in place of the second resistance, the other ends of the parallel connection are grounded, and the resonance circuit is composed of the coil and the second capacitor, so that this has an effect of easily ensuring the negative resistance at the high frequency.

The present invention is the high-frequency Colpitts circuit, wherein a resonance frequency is controlled by the resonance circuit, so that this has an effect of easily controlling the negative resistance characteristic.

The present invention is the high-frequency Colpitts circuit, wherein a resistance value of the feedback resistance is set to be larger than resistance values of the first and third resistances.

The present invention is the high-frequency Colpitts circuit, wherein elements composing the circuit are IC implemented.

DESCRIPTION OF REFERENCE NUMERALS

Q1 transistor
Q2 transistor
Rf feedback resistance
R1, R2, R3, R4, R5, R6, R7 resistance
C1, C2, C3, C4, C5 capacitor
L1 coil

DESCRIPTION OF THE PREFERRED EMBODIMENT

An embodiment of the present invention is described with reference to drawings.
[Overview of Embodiment]

In a high-frequency Colpitts circuit according to the embodiment of the present invention, a supply voltage is applied to a collector of an oscillation transistor Q1 through a first resistance (R3), a crystal oscillator and one end of first and second capacitors (C1) and (C2) connected in series are connected to a base of the oscillation transistor Q1, the other end of the capacitors is grounded, a point between the first and second capacitors (C1) and (C2) is connected to an emitter of the oscillation transistor Q1 and is grounded through a second resistance (R4), a feedback transistor Q2 to a base of which the collector of the oscillation transistor Q1 is connected is provided, the supply voltage is applied to a collector of the feedback transistor Q2 through a third resistance (R5) and is connected to an output terminal, and the collector is connected to the base of the oscillation transistor Q1 through a feedback resistance (Rf); and a stable oscillation may be realized even at a high frequency and a scale of the circuit may be made smaller.

Also, in the high-frequency Colpitts circuit according to the embodiment of the present invention, the point between the first and second capacitors (C1) and (C2) is connected to the emitter of the oscillation transistor Q1, a coil (L1) is connected in series to the second resistance (R4) and the third capacitor (C3) connected in parallel, the other ends of the parallel connection are grounded, and a resonance circuit is composed of the coil (L1) and the second capacitor (C2); and a negative resistance at the high frequency may be easily ensured.

Figure 1:
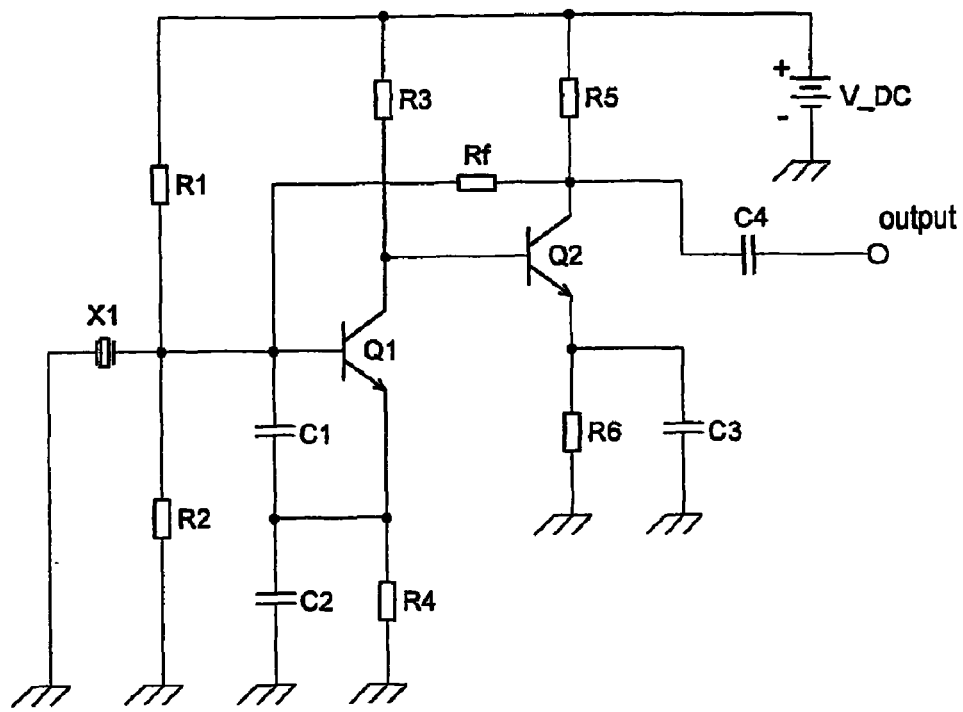
FIG. 1 is a configuration diagram of a high-frequency Colpitts circuit according to an embodiment of the present invention.

[High-Frequency Colpitts Circuit: FIG. 1]

The high-frequency Colpitts circuit (the present circuit) according to the embodiment (first embodiment) of the present invention is described with reference to FIG. 1. FIG. 1 is a configuration diagram of the high-frequency Colpitts circuit according to the embodiment of the present invention.

The present circuit integrates a negative feedback circuit in order to increase a degree of amplitude of the oscillation circuit, as shown in FIG. 1.

Specifically, as shown in FIG. 1, the present circuit is provided with a terminal (Port P1) to which the crystal oscillator is connected, the transistor (oscillation transistor) Q1 for amplifying an oscillation frequency of the crystal oscillator, and the transistor (feedback transistor) Q2, which composes the feedback circuit in which the terminal is connected to the base of the transistor Q1, the supply voltage (V_DC) is applied to the collector of the transistor Q1 through the resistance R3, further the supply voltage is connected to the base through the resistance R1 and the base is grounded through the resistance R2.

Also, the emitter of the transistor Q1 is grounded through the resistance R4, the base of the transistor Q1 is grounded through the capacitors C1 and C2 connected in series, and the point between the capacitors C1 and C2 is connected to the emitter.

An amplified oscillation frequency is applied from the collector of the transistor Q1 to the base of the transistor Q2, the supply voltage is applied to the collector of the transistor Q2 through the resistance R5, and the output terminal is provided on the collector through the capacitor C4.

Also, the collector of the transistor Q2 is connected to the base of the transistor Q1 through the feedback resistance Rf. Also, a resistance R6 and a capacitor C3 connected in parallel are connected to the emitter of the transistor Q2, and the other end of each of them is grounded.

Meanwhile, the resistances R3, R4 and R5 correspond to first, second and third resistances in claims, respectively, and the capacitors C1 and C2 correspond to the first and second capacitors in claims, respectively.

The resonance circuit composed of the capacitor C2 and the coil L1 connected in parallel may be provided in place of the capacitor C2 to control a resonance frequency by the resonance circuit.

Figure 2:
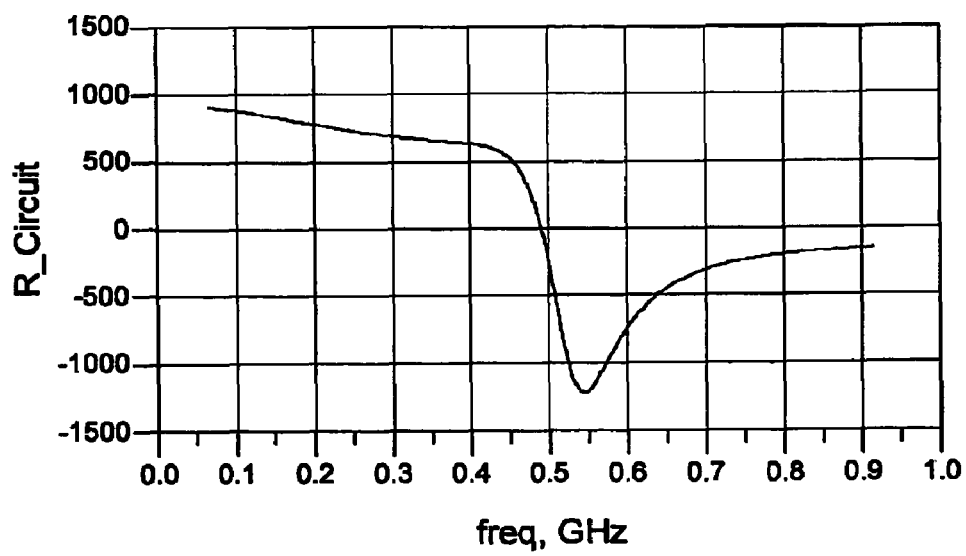
FIG. 2 is a view showing a negative resistance characteristic of the present circuit (first embodiment)

[Operation and Characteristic of the Present Circuit: FIG. 2]

In the present circuit, it is configured such that a signal taken out of the collector of the transistor Q2 is fed back to the base of the transistor Q1 through the feedback resistance Rf. Herein, since an entire circuit might oscillate when a resistance value of the feedback resistance Rf is small, this is set to be the resistance value larger than that of the resistances R3 and R5. Also, a feedback amount is adjusted by adjusting the resistance value of the feedback resistance Rf.

Thus configured, the negative resistance at the high frequency may be ensured.

A negative resistance characteristic in FIG. 1 is shown in FIG. 2. FIG. 2 is a view showing the negative resistance characteristic of the present circuit (first embodiment).

In the present circuit, although it is required to make capacitances of the capacitors C1 and C2 smaller in order to ensure the negative resistance at the high frequency, it is considered that a limit of a stable frequency oscillation in the present circuit is approximately 700 MHz.

[Effect of the Present Circuit]

According to the present circuit, since it is configured such that an output signal from the collector of the transistor Q2 is input to the base of the transistor Q1 through the feedback resistance Rf, this may be high-frequency compatible, and there is an effect that the scale of the entire circuit may be made smaller for the high-frequency compatible circuit.

Figure 3:
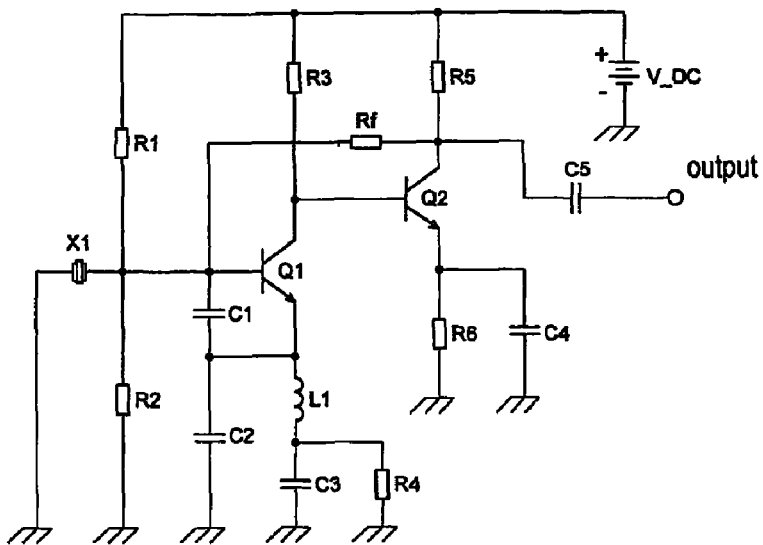
FIG. 3 is a configuration diagram of the Colpitts circuit according to another embodiment.

[Another Circuit: FIG. 3]

Next, the high-frequency Colpitts circuit (another circuit) according to another embodiment (second embodiment) is described with reference to FIG. 3. FIG. 3 is a configuration diagram of the Colpitts circuit according to another embodiment.

As shown in FIG. 3, although another circuit is basically similar to the present circuit in FIG. 1, this is different from the present circuit in that one end of the coil L1 is connected to the emitter of the transistor Q1, the capacitor C3 and the resistance R4 connected in parallel are connected to the other end of the coil L1, and the other ends thereof are grounded.

Herein, the capacitor C2 and the coil L1 may compose the resonance circuit (synchronization circuit) to easily control a peak of the negative resistance. By controlling the peak by the resonance circuit, it is possible to support the high frequency without making the capacitances of the capacitors C1 and C2 smaller.

Meanwhile, the coil L1 and the capacitor C3 correspond to a first coil and a third capacitor in claims, respectively.

Figure 4:
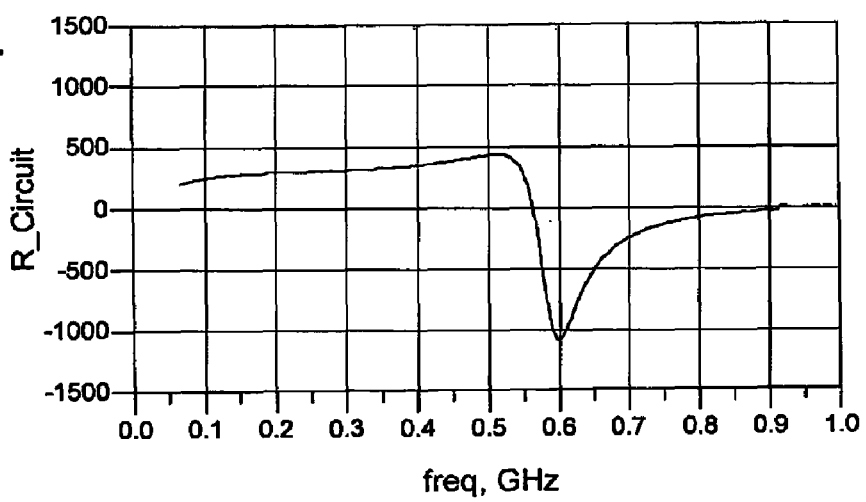
FIG. 4 is a view showing a negative resistance characteristic (I) of another circuit.

[Negative Resistance Characteristic (1) of Another Circuit: FIG. 4]

Next, a negative resistance characteristic (1) of another circuit (second embodiment) is described with reference to FIG. 4. FIG. 4 is a view showing the negative resistance characteristic (1) of another circuit.

In FIG. 4, the stable oscillation is realized in the negative resistance at 600 MHz.

Figure 5:
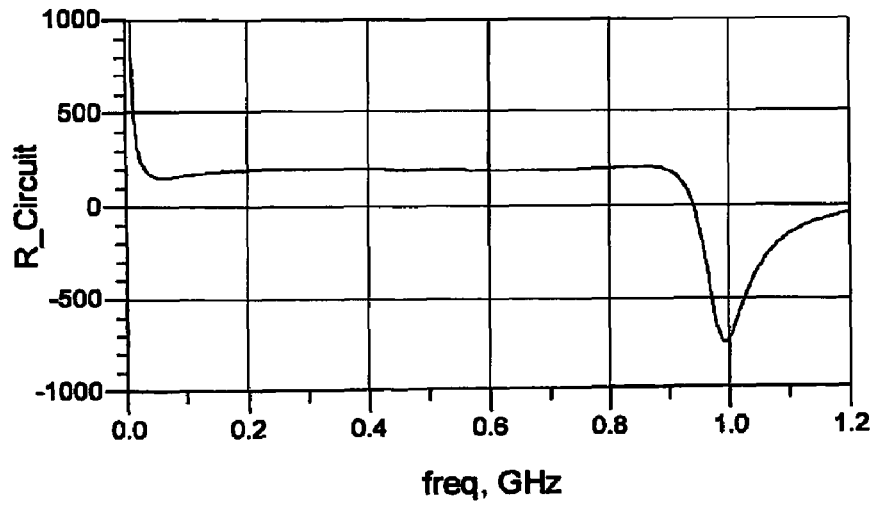
FIG. 5 is a view showing a negative resistance characteristic (II) of another circuit.
Figure 6:
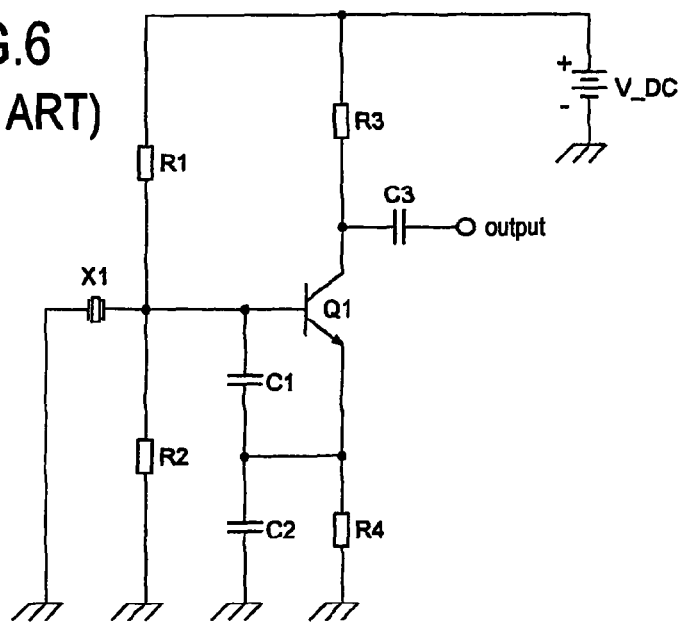
FIG. 6 is a configuration diagram of a conventional Colpitts circuit.
Figure 7:
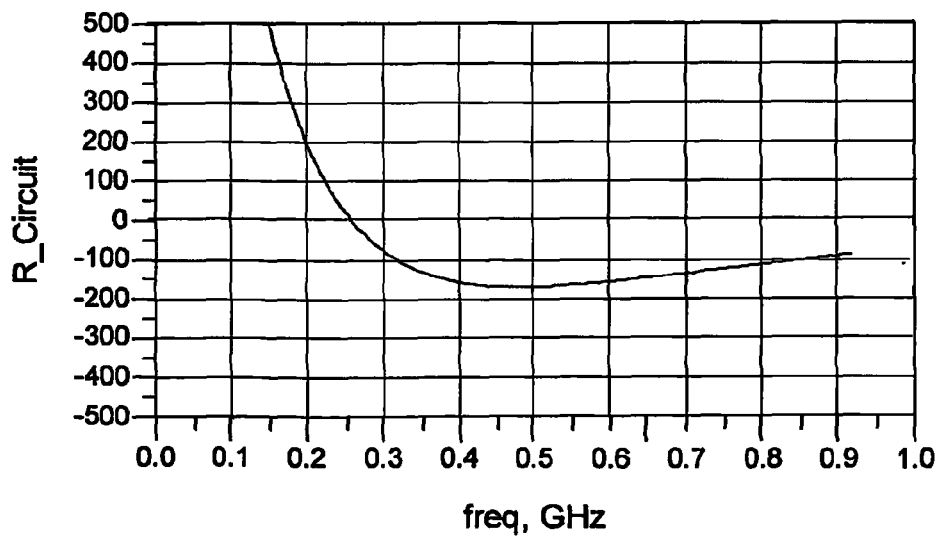
FIG. 7 is a view showing a negative resistance characteristic of the conventional Colpitts circuit.

[Negative Resistance Characteristic (2) of Another Circuit: FIG. 5]

Also, a negative resistance characteristic (2) of another circuit (second embodiment) is described with reference to FIG. 5. FIG. 5 is a view showing the negative resistance characteristic (2) of another circuit.

In FIG. 5, the stable oscillation is realized in the negative resistance at 1 GHz by controlling the resonance frequency in the resonance circuit.

[Effect of Another Circuit]

According to another circuit, there is an effect of enabling the stable oscillation at the frequency of 700 MHz or higher by controlling the resonance frequency in the resonance circuit.

[Effect of the Present Circuit and Another Circuit]

Also, according to the present circuit and another circuit, since it is configured to feedback using the feedback resistance Rf, the high-capacitance capacitor is not required, so that they are suitable for IC implementation of an entire circuit.

The present invention is suitable for the high-frequency Colpitts circuit capable of realizing the stable oscillation even at the high frequency and of making the scale of the circuit smaller.

What is claimed is:

1. A high-frequency Colpitts circuit for realizing an oscillation at a high frequency, comprising:
   an oscillation transistor for amplifying an oscillation frequency signal from a crystal oscillator; and
   a feedback transistor to a base of which a collector of the oscillation transistor is connected; wherein
   a supply voltage is applied to the collector of the oscillation transistor through a first resistance,
   one end of first and second capacitors connected in series is connected to a base of the oscillation transistor and the other end of the capacitors is grounded,
   a point between the first and second capacitors is connected to an emitter of the oscillation transistor, one end of a coil is connected to the emitter, a second resistance and a third capacitor connected in parallel is connected in series to the other end of the coil, the other ends of the parallel connection are grounded, and a resonance circuit is composed of the coil and the second capacitor, and
   the supply voltage is applied to a collector of the feedback transistor through a third resistance and is connected to an output terminal and the collector is connected to the base of the oscillation transistor through a feedback resistance.

2. The high-frequency Colpitts circuit according to claim 1, wherein a resistance value of the feedback resistance is set to be larger than resistance values of the first and third resistances.

3. The high-frequency Colpitts circuit according to claim 2, wherein elements composing the circuit are IC implemented.

4. The high-frequency Colpitts circuit according to claim 1, wherein elements composing the circuit are IC implemented.

* * * * *